United States Patent
Alpert et al.

(10) Patent No.: US 7,467,369 B2
(45) Date of Patent: Dec. 16, 2008

(54) CONSTRAINED DETAILED PLACEMENT

(75) Inventors: Charles J. Alpert, Cedar Park, TX (US); Gi-Joon Nam, Austin, TX (US); Haoxing Ren, Austin, TX (US); Paul G. Villarrubia, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 67 days.

(21) Appl. No.: 11/554,235

(22) Filed: Oct. 30, 2006

(65) Prior Publication Data

US 2008/0127017 A1    May 29, 2008

(51) Int. Cl.
*G06F 17/50* (2006.01)
*G06F 9/45* (2006.01)

(52) U.S. Cl. .................. 716/9; 716/8; 716/10; 716/11
(58) Field of Classification Search ................ 716/6–11
See application file for complete search history.

(56) References Cited

U.S. PATENT DOCUMENTS 6,080,201 A * 6/2000 Hojat et al. .................... 703/14
6,415,426 B1 * 7/2002 Chang et al. .................... 716/9

OTHER PUBLICATIONS

Kahng et al., APlace: A General Analytic Placement Framework, ACM, Apr. 3-6, 2005, pp. 233-235.*
Liu, Individual Wire-Length Prediction With Application to Timing-Driven Placement, IEEE, Oct. 2004, pp. 1004-1014.*
Ren et al., "Hippocrates: First-Do-No-Harm Detailed Placement", Austin Conference on Integrated Systems & Circuits 2006, May 2006, pp. 1-7.

* cited by examiner

*Primary Examiner*—Jack Chiang
*Assistant Examiner*—Nghia M Doan
(74) *Attorney, Agent, or Firm*—Duke W. Yee; Casimer K. Salys; LaRhonda Jefferson-Mills

(57) ABSTRACT

The illustrative embodiments provide a computer implemented method which perform cell transforms that decrease overall wire length, without degrading device timing or violating electrical constraints. The process computes delay constraint coefficients for a data set. The process performs a detailed placement transform by moving a subset of cells, making the placement legal, computing a half perimeter wire length change for each output net that is a member of the subset of nets, and computing a Manhattan distance change for each source-sink gate pair within the move cells. the process computes a weighted total wire length incremented value for the transformed data set. Further, the process continues by evaluating arrival time constraints, electrical constraints, and user configurable move limits for violations, and restoring the move cells to the original placement if a violation is found.

8 Claims, 3 Drawing Sheets

CONSTRAINED DETAILED PLACEMENT

BACKGROUND OF THE INVENTION

1. Field of the Invention

The illustrative embodiments relate to data processing systems for physical synthesis of semiconductor devices. More particularly, the illustrative embodiments relate to a set of pin-based constraints for detailed placement that may streamline the wire length reduction process without degrading device timing.

2. Description of the Related Art

Physical synthesis is the process in which a semiconductor device is taken from the list of components and connections, called a netlist, to a geometrical layout of the device. Global placement is one of the critical processes in physical synthesis. The task of global placement is to determine the overall locations of standard cells in a semiconductor device design. After global placement, the design is typically optimized with respect to device timing.

However, transforms may be performed to reduce the weighted total wire length (WTWL) of the device. During each transform, the module may recursively move one or multiple cells according to transform guidelines. The placement of the cells after these moves may not be legal, thus the transform may also need to legalize the placement by sliding cells along the circuit row. After legalization, the transform has produced a new legal placement.

A detailed placement module performs transforms to convert cell placement from one location to another location within the device. These transforms may insert new cells or change the size of existing cells. The transforms are generally an iterative process performing a series of incremental move steps. Placement changes may result in overlaps between cells. Legalization algorithms have been developed to remove the cell overlaps. Legalization algorithms are designed to minimize the disturbance to the original placement. Therefore, these transforms take a legally placed netlist and change locations of cells while still maintaining legality.

The typical legalization algorithm may result in some wire length degradation. In addition, the relative order of newly inserted or resized cells, are not fully optimized. These transforms only check whether the movements reduce the total wire length. Some detailed placement techniques may help reduce wire length but typically, these techniques also degrade the timing that was previously optimized by physical synthesis. In addition, reducing total wire length may not result in a timing improvement of the overall device. There may be no timing improvement because detailed placement may increase the wire length on critical paths while reducing the total wire length.

Detailed placement transforms may also violate electrical constraints. Electrical constraints are comprised of slew limits and capacitance limits. Slew limits define the maximum slews permissible on all nets of the design. Slew is a value representing the maximum rate of change of signal at a gate output. Capacitance limits define the maximum effective capacitance that a gate or an input pin may drive. Violations of these rules, referred to as slew violations and capacitance violations taken together are called electrical violations. The time involved in re-optimization of electrical parameters and wire length may add significantly to the overall design flow cycle time.

SUMMARY OF THE INVENTION

The illustrative embodiments provide a computer implemented method which performs cell transforms that decrease overall wire length, without degrading device timing or violating electrical constraints. The process computes delay constraint coefficients for a data set. The process performs a detailed placement transform by moving a subset of cells, making the placement legal, computing a half perimeter wire length change for each output net that is a member of the subset of nets, and computing a Manhattan distance change for each source-sink gate pair within the move cells. The process computes a weighted total wire length incremented value for the transformed data set. Further, the process continues by evaluating arrival time constraints, electrical constraints, and user configurable move limits for violations, and restoring the move cells to the original placement if a violation is found.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
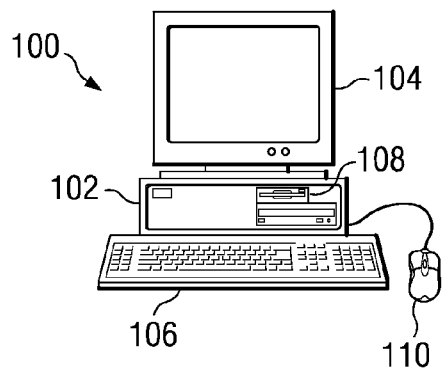
FIG. 1 is a pictorial representation of a data processing system in which illustrative embodiments may be implemented.

With reference now to the figures and in particular with reference to FIG. 1, a pictorial representation of a data processing system is shown in which illustrative embodiments may be implemented. Computer 100 includes system unit 102, video display terminal 104, keyboard 106, storage devices 108, which may include floppy drives and other types of permanent and removable storage media, and mouse 110. Additional input devices may be included with personal computer 100. Examples of additional input devices include a joystick, touchpad, touch screen, trackball, microphone, and the like.

Computer 100 may be any suitable computer, such as an IBM® eServer™ computer or IntelliStation® computer, which are products of International Business Machines Corporation, located in Armonk, N.Y. Although the depicted representation shows a personal computer, other embodiments may be implemented in other types of data processing systems. For example, other embodiments may be implemented in a network computer. Computer 100 also preferably includes a graphical user interface (GUI) that may be implemented by means of systems software residing in computer readable media in operation within computer 100.

Figure 2:
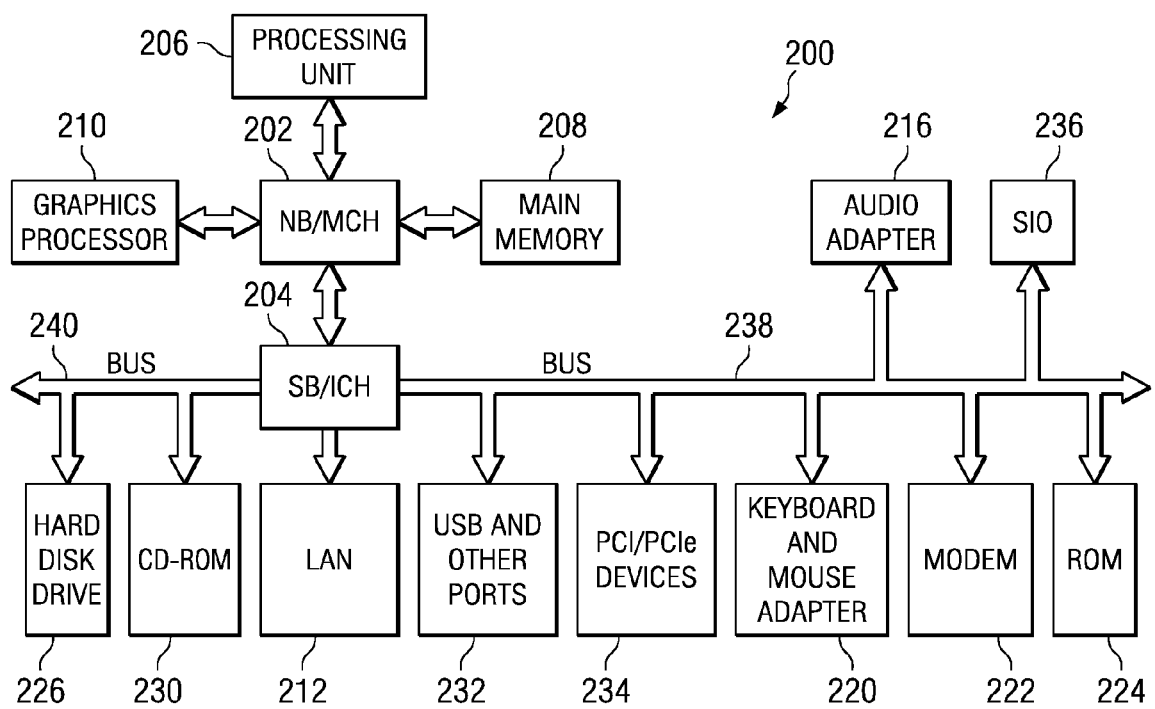
FIG. 2 depicts a block diagram of a data processing system in which illustrative embodiments may be implemented.

Next, FIG. 2 depicts a block diagram of a data processing system in which illustrative embodiments may be implemented. Data processing system 200 is an example of a computer, such as computer 100 in FIG. 1, in which code or instructions implementing the processes of the illustrative embodiments may be located.

In the depicted example, data processing system 200 employs a hub architecture including a north bridge and memory controller hub (MCH) 202 and a south bridge and input/output (I/O) controller hub (ICH) 204. Processing unit 206, main memory 208, and graphics processor 210 are coupled to north bridge and memory controller hub 202. Processing unit 206 may contain one or more processors and even may be implemented using one or more heterogeneous processor systems. Graphics processor 210 may be coupled to the MCH through an accelerated graphics port (AGP), for example.

In the depicted example, local area network (LAN) adapter 212 is coupled to south bridge and I/O controller hub 204, audio adapter 216, keyboard and mouse adapter 220, modem 222, read only memory (ROM) 224, universal serial bus (USB) ports, and other communications ports 232. PCI/PCIe devices 234 are coupled to south bridge and I/O controller hub 204 through bus 238. Hard disk drive (HDD) 226 and CD-ROM drive 230 are coupled to south bridge and I/O controller hub 204 through bus 240.

PCI/PCIe devices may include, for example, Ethernet adapters, add-in cards, and PC cards for notebook computers. PCI uses a card bus controller, while PCIe does not. ROM 224 may be, for example, a flash binary input/output system (BIOS). Hard disk drive 226 and CD-ROM drive 230 may use, for example, an integrated drive electronics (IDE) or serial advanced technology attachment (SATA) interface. A super I/O (SIO) device 236 may be coupled to south bridge and I/O controller hub 204.

An operating system runs on processing unit 206. This operating system coordinates and controls various components within data processing system 200 in FIG. 2. The operating system may be a commercially available operating system, such as Microsoft® Windows XP®. (Microsoft® and Windows XP® are trademarks of Microsoft Corporation in the United States, other countries, or both). An object oriented programming system, such as the Java™ programming system, may run in conjunction with the operating system and provides calls to the operating system from Java™ programs or applications executing on data processing system 200. Java™ and all Java-based trademarks are trademarks of Sun Microsystems, Inc. in the United States, other countries, or both.

Instructions for the operating system, the object-oriented programming system, and applications or programs are located on storage devices, such as hard disk drive 226. These instructions and may be loaded into main memory 208 for execution by processing unit 206. The processes of the illustrative embodiments may be performed by processing unit 206 using computer implemented instructions, which may be located in a memory. An example of a memory is main memory 208, read only memory 224, or in one or more peripheral devices.

The hardware shown in FIG. 1 and FIG. 2 may vary depending on the implementation of the illustrated embodiments. Other internal hardware or peripheral devices, such as flash memory, equivalent non-volatile memory, or optical disk drives and the like, may be used in addition to or in place of the hardware depicted in FIG. 1 and FIG. 2. Additionally, the processes of the illustrative embodiments may be applied to a multiprocessor data processing system.

The systems and components shown in FIG. 2 can be varied from the illustrative examples shown. In some illustrative examples, data processing system 200 may be a personal digital assistant (PDA). A personal digital assistant generally is configured with flash memory to provide a non-volatile memory for storing operating system files and/or user-generated data. Additionally, data processing system 200 can be a tablet computer, laptop computer, or telephone device.

Other components shown in FIG. 2 can be varied from the illustrative examples shown. For example, a bus system may be comprised of one or more buses, such as a system bus, an I/O bus, and a PCI bus. Of course the bus system may be implemented using any suitable type of communications fabric or architecture that provides for a transfer of data between different components or devices attached to the fabric or architecture. Additionally, a communications unit may include one or more devices used to transmit and receive data, such as a modem or a network adapter. Further, a memory may be, for example, main memory 208 or a cache such as found in north bridge and memory controller hub 202. Also, a processing unit may include one or more processors or CPUs.

The depicted examples in FIG. 1 and FIG. 2 are not meant to imply architectural limitations. In addition, the illustrative embodiments provide for a computer implemented method, apparatus, and computer usable program code for compiling source code and for executing code. The methods described with respect to the depicted embodiments may be performed in a data processing system, such as data processing system 100 shown in FIG. 1 or data processing system 200 shown in FIG. 2.

The illustrative embodiments provide a computer implemented method and computer program product for an improved detailed placement module. Detailed placement is a placement transformation that converts the placement of a cell from one legal position to another legal position within the device. A cell is comprised of electrical components with input and output pins interconnected by a set of nets. A net, as defined herein, is comprised of the input and output pins and the wires in between the pins. A netlist is a list of nets for the electrical components. Legality means the cells are within the design rule overlap constraints. Design rules are defined by the design engineer and are typically based on the technology of the semiconductor device. The improved module checks for violations of additional constraints before allowing a transformation. The additional constraints prohibited by the improved detailed placement module are rules based on calculations estimating the pin level gate delay, wire delay, and skew. The module then creates a preliminary transform subnet containing only those nets found in the move subcell. From the height and width of the move subcell the module calculates the half perimeter line width. From the half perimeter line width, the module calculates the change in distance of the nets in the netlist subset and therefore the change in wire length.

The module then compares the preliminary cell to the constraint rules. If the move subcell violates any constraint rule, the cell transform is not allowed. Violating at least one of the set of constraint rules means that any one of the set of constraint rules is violated. For example, if skew is violated, the cell transform is not allowed. In addition, if more than one constraint rule is violated, such as an electrical constraint and the move limit are violated the cell transform is not allowed. Conversely, if the move subcell transform is within the constraint rules the sub-cell transform is allowed. A cell transform using the improved detailed placement module may not degrade the overall timing of the device.

Figure 3:
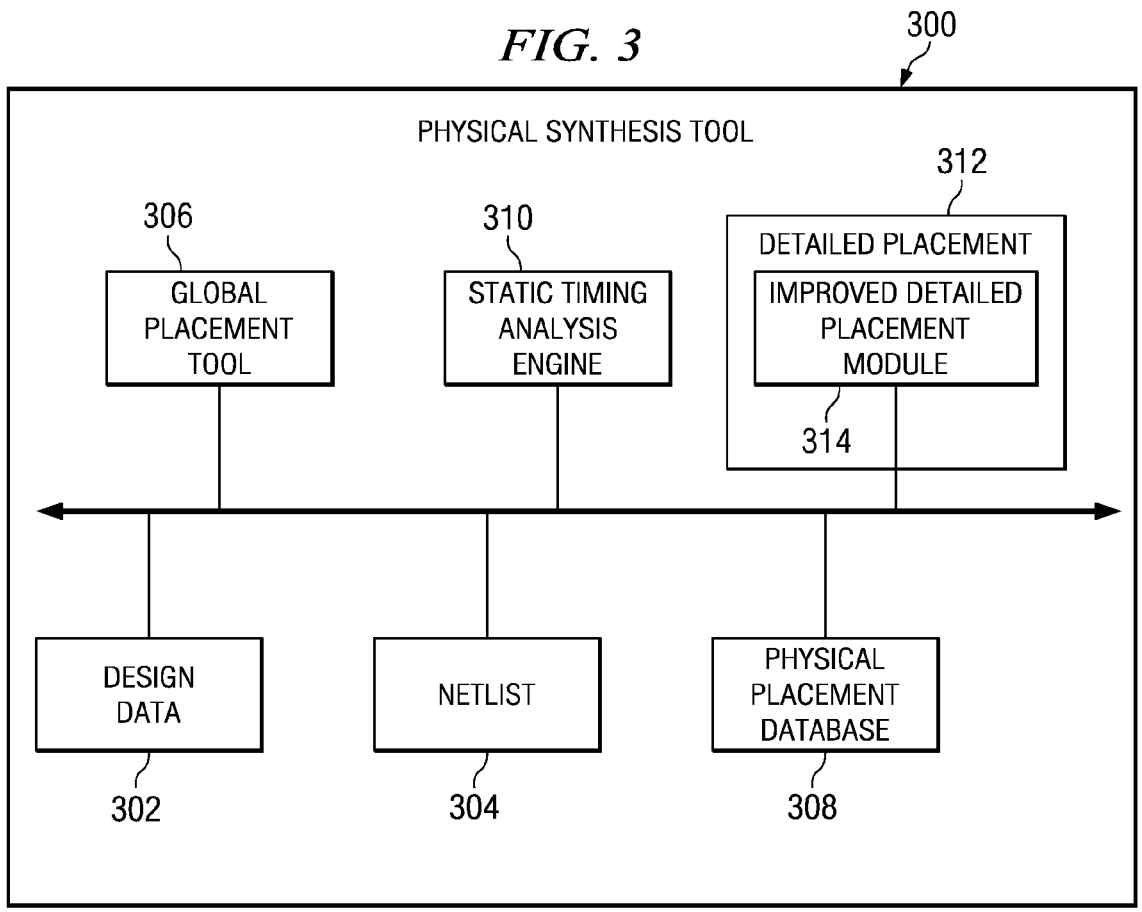
FIG. 3 is a block diagram of the components of a physical synthesis tool in which an improved detailed placement module may be implemented in accordance with the illustrative embodiments.

FIG. 3 is a block diagram of the components of a physical synthesis tool in which the improved module may be implemented in accordance with the illustrative embodiments. Physical synthesis tool 300 may be any commercial physical synthesis tool, such as the Cadences® tool First Encounter®. Cadence headquarters is located in San Jose Calif. Physical synthesis tool 300 comprises at least the components depicted in FIG. 3, however, other components may be a part of physical synthesis tool 300. Design data 302 is the data set of design rules and specifications that are adhered to within the current device data set. Netlist 304 is the netlist for the current device. A netlist is the list of the electrical components and the interconnections for those components. Global placement tool 306 places the geometries associated with the components indicated in netlist 304 into a global device geometry. "Places" as used herein means to put a simulated geometry of a device component within a simulated device. Global placement tool 306 places each of the components of the device into the confines of the device borders, and interconnects the components together in accordance with the netlist. Global placement tool 306 also checks for placement legality. An illegal placement has cells that overlap. Cells are groups of components with related interconnections. Global placement tool 306 stores the information for all of the placements in the physical placement database 308. Physical synthesis tool 300 may have a static timing analysis engine 310 incorporated into the tool. Detailed placement 312 performs moves on cells, called transforms. Detailed placement 312 ensures that the moves are legal. Improvements are incorporated into detailed placement module 312, forming improved detailed placement module 314, according to the illustrative embodiments. Improved detailed placement module 314 manages the tasks required to provide pin-based timing, and electrical constraint rules to prevent detailed placement from degrading the timing or violating electrical constraints, while ensuring an overall reduction in weighted wire length.

Figure 4:
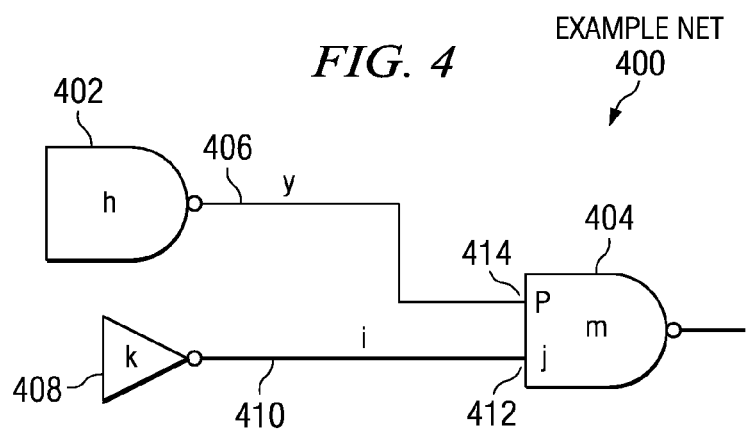
FIG. 4 is a critical path and delta arrival time schematic according to the illustrative embodiments.

FIG. 4 is a schematic diagram illustrating a critical path in accordance with the illustrative embodiments. The set of gates h 402, m 404, are interconnected by net y 406. Gate k 408 and m 404 are interconnected by net i 410. Two pins j 412 and p 414 are input pins to gate m 404. Consider the case where net y 406 has a longer delay time than net i 410. The critical path to gate m 404 is then gate k 408 through net i 410 to pin j 412. The net y 406 connecting gate h 402 and gate m 404 is not critical for the net of gate m 404. A source sink gate pair is a pair of gates such as gate k and gate m.

Figure 5:
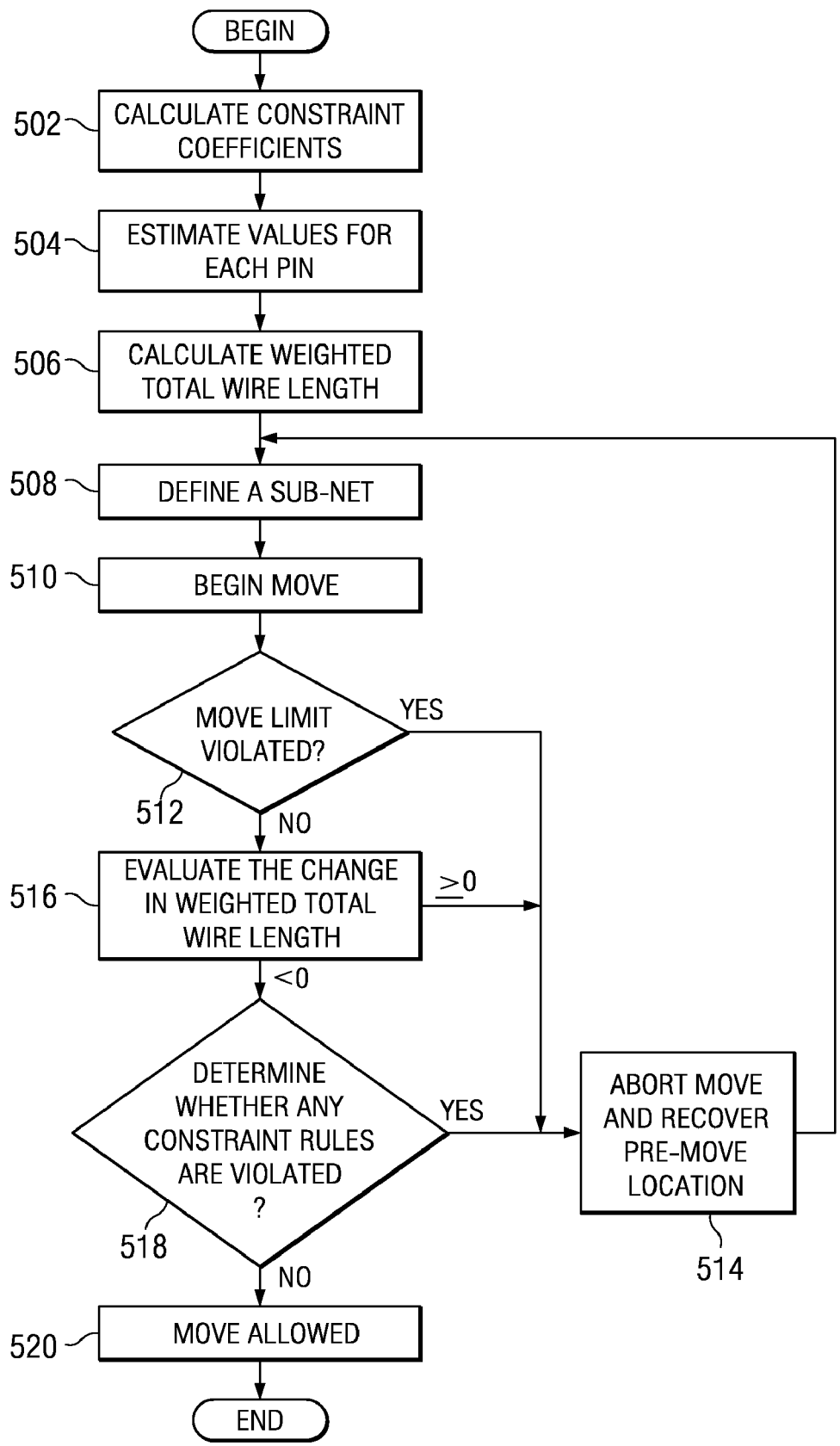
FIG. 5 is a flow chart indicating the top level flow for the improved detailed placement module in accordance with the illustrative embodiments.

FIG. 5 is a flow chart indicating the top level flow for the constrained detailed placement module in accordance with the illustrative embodiments. The process takes place within the physical synthesis tool, such as physical synthesis tool 300 in FIG. 3.

The process begins by calculating the constraint coefficients (step 502). To calculate the constraint coefficients, the process uses data from the physical placement data set, the netlist and the static timing analysis such as physical placement database 308, netlist 304, and static timing analysis engine 310 of FIG. 3.

The coefficients are then calculated as follows:

$$\alpha = A_k c$$

$$\beta = K_D r(c \cdot \text{pre-move\_l}_{k,m} + cpin_k)$$

-continued $$\delta = K_D \frac{rc}{2}$$

$$\varsigma = B_k c$$

$$\eta = K_s r(c \cdot \text{pre-move\_l}_{k,m} + cpin_k)$$

$$\theta = K_s \frac{rc}{2}$$

wherein $A_k$ is the gate delay sensitivity to output load capacitance for gate k, $B_k$ is the gate output slew sensitivity to output load capacitance for gate k ($A_k$ and $B_k$ can be determined by the standard cell library characterization), c and r is the unit wire capacitance and resistance (here we only use one wiring layer for estimation), and $K_D$=0.69, and $K_s$=2.2 are constants based on transition of 10% to 90% VDD.

The process converts the wire delay, gate delay, arrival times, and skews to estimated values for each pin by taking the slew data and the arrival time data from the static timing module (step 504).

The process also calculates the weighted total wire length of the device data set (step 506). Critical nets are given higher weights than other nets. Critical nets are nets with negative slack. Slack is the difference between arrival time and required arrival time. The weighted wire length function is given below:

WTWL=$\Sigma w_i l_i$ wherein WTWL is the weighted total wire length and $w_i$ is the net weight for net i, and $l_i$ is the half perimeter of the wire length (HPWL) of net i. The net weight of i, or $w_i$ is a simple slack based net weight assignment shown as follows:

$w_i = \mu - \lambda slk_i$ if $slk_i < 0$ $\mu$ if $slk_i \geq 0$ wherein $slk_i$ is the slack on net i; $\mu$ and $\lambda$ are positive constants between 10 and 100.

Next, the process defines a sub-net within the device data set to be transformed to another location in the device data set (step 508). The process calculates the physical dimensions of the sub-net using a half perimeter wire length (HPWL). The half perimeter wire length (HPWL) of a net may be determined by forming the smallest square around the net and adding the values of two adjacent sides of the square. This value may be readily available to the improved detailed placement module, such as improved detailed placement module 314 in FIG. 3.

The process computes the change in distance for the sub-net and the change of distance for each pin in the sub-net. In one embodiment, the process uses a Manhattan distance between the gates. A Manhattan distance is a method of measuring distances on a grid. The Manhattan distance is defined as the distance that would be traveled to get from one point to the other if a grid-like path is followed.

The process then begins a move (step 510). Since the differential delay/slew modeling is not based on actual routing, the delay/slew modeling may become inaccurate when cells move a long distance. The inaccuracy may become acute for cells connected to high fanout nets. A high fanout net is a net composed of more sub-nets than a critical number. In one embodiment, the smallest number of sub-nets in a high fanout net is a user configurable number. Therefore, to estimate delay/slew on critical nets more accurately, a maximum move limit on those cells connected to critical nets with high fanout is imposed (step 512). The move limit prevents the high fanout nets from moving so far as to make the differential delay/slew estimations invalid. In one illustrative embodiment, the move limit of a high fanout net is a user configurable number.

If the move exceeds a high fanout move limit, (yes output to step 512) the process proceeds to abort the move and recover the pre-move locations of the high fanout net (step 514). If the move is less than the move limit on a high fanout move (no output to 512) the analysis of the move proceeds.

Next the process evaluates the incremented weighted total wire length ($\Delta$WTWL) value (step 516) as follows:

$$\Delta WTWL = \sum_{i \in M} w_i \Delta l_i$$

wherein each i is a member of the sub-net and $\Delta l_i$ is the change in the wire length of each net in the sub-net.

If the incremented weighted total wire length (WTWL) value is negative (a negative value in step 516), the improved detailed placement module continues analysis on the sub-net move. Otherwise (a positive or zero value in step 516) the process rejects the sub-net move. The process determines whether the weighted total wire length (WTWL) of the moved subnet is less than the original weighted total wire length, and therefore a beneficial move to implement. If the move does not reduce the weighted total wire length or if the move increases the weighted total wire length the sub-net is not beneficial and the net is restored to its pre-move location.

During a move process, the improved module calculates a new value for the pin based delay and electrical parameters in the moved sub-net (step 518). The delay times are estimated by calculating the arrival time of each pin of a gate. The arrival time of each pin is defined as the summation of delay segments from timing start points to the most critical input pin, such as critical input pin j 412 in FIG. 4. In addition to delay constraints, the process determines electrical constraints, such as maximum output capacitance and maximum input slew. The output capacitance constraint specifies the maximum load capacitance a gate can drive, including wire capacitances and sink pin capacitances. Wire capacitances and sink pin capacitances are the input pin capacitances on the pins to which a net is connected. The slew constraint specifies the maximum slew on an input pin.

Next the process determines whether any constraint rules are violated (step 518) using the following combination delay time and electrical constraint rules:

$$\alpha \Delta l_i + \beta \Delta l_{k,m} + \eta \Delta l_{k,m}^2 \leq \Delta AT_{m,j}$$

$$\zeta \Delta l_i + \eta \Delta l_{k,m} + \theta \Delta l_{k,m}^2 \leq s_{m,j}^{max} - \text{pre-move}\_s_j$$

$$c \Delta l_i \leq c_k^{max} - \text{pre-move}\_c_k$$

wherein pin j is the input pin of gate m, which is connected to gate k by net i, such as gate m 404, input pin j 412, gate k 408 and net i 410 of FIG. 4.

Coefficients $\alpha$, $\beta$, $\eta$, $\zeta$, $\delta$, and $\theta$ are calculated in step 502.

$\Delta l_i$ is the change of the half perimeter wire length of the total wire length for net i which gate k drives.

$\Delta l_{k,m}$ is the change of delay time between the moved subnet and the pre-moved subnet, between gate k and gate m.

$\Delta AT_{m,j}$ is the change in arrival time between gate m and input pin j.

$s_{m,j}^{max} - \text{pre-move}\_s_{m,j}$ is the difference between the maximum input pin slew on pin j of gate m and the pre-move slew rate.

$c \Delta l_i \leq c_k^{max} - \text{pre-move}\_c_k$ makes sure the increase on slew is less than the difference of the maximum allowed slew and pre-move slew.

The moved sub-net may not be accepted if one of the constraint rules is violated. If yes, a rule is violated (yes output to step 518), then the move is not performed and the process proceeds to step 514. If no, the constraint rules are not are violated (no output to step 518), then the move is allowed (step 520). The process terminates thereafter.

A non-deteriorating timing result is provided by the improved detailed placement module, because all of the delay constraints are satisfied during any placement transformation. The timing and electrical constraints may be directly used in any detailed placement framework which uses an evaluate and execute approach and may be modified to be used in other detailed placement frameworks which use model based approaches.

The illustrative embodiments provide a computer implemented method and computer program product for an improved detailed placement module. The improved module provides pin-based timing, and electrical constraint rules to prevent detailed placement from degrading timing or violating electrical constraints, while ensuring an overall reduction in weighted wire length.

The improved module defines constraint rules. Each move in a detailed placement transform must satisfy the constraint rules. If the constraint rules are not satisfied, the move is rejected. The improved module estimates parameters, such as delay time and skew, on individual pins, rather than timing paths. The module then compares pre-move parameters to post-move parameters. The coefficients for these calculations are calculated using a placement data set as well as data from a static timing analysis. The constraint coefficients for a particular device data set are generated once during the detailed placement optimization phase of the device design. These coefficients then remain valid throughout the detailed placement process.

The invention can take the form of an entirely hardware embodiment, an entirely software embodiment or an embodiment containing both hardware and software elements. In a preferred embodiment, the invention is implemented in software, which includes but is not limited to firmware, resident software, microcode, etc.

Furthermore, the invention can take the form of a computer program product accessible from a computer-usable or computer-readable medium providing program code for use by or in connection with a computer or any instruction execution system. For the purposes of this description, a computer-usable or computer readable medium can be any tangible apparatus that can contain, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A computer implemented method for managing constraints for detailed placement transforms, the computer implemented method comprising:
   computing delay constraint coefficients for a data set using data from a static timing analysis and from legal physical placement data, wherein the data set includes nets;
   computing a net weight for each net in the data set;
   computing a weighted total wire length for the data set;
   assigning a user configurable move limit for a set of cells, wherein the set of cells connect to a set of critical nets in the data set;
   creating move cells by moving a subset of cells according to a detailed placement transform;
   sliding the move cells to make a legal placement;
   identifying a subset of nets that are changed by the legal placement of the move cells;
   computing a half perimeter wire length change for each output net that is a member of the subset of nets;
   computing a Manhattan distance change for each source-sink gate pair within the move cells to form a transformed data set;
   determining whether the user configurable move limit has been exceeded;
   computing a weighted total wire length incremented value for the transformed data set;
   restoring move cells to an original placement in the data set if the weighted total wire length incremented value of the transformed data set comprises a zero or positive value;
   evaluating arrival time constraints, electrical constraints, and user configurable move limits if the weighted total wire length incremented value of the transformed data set comprises a negative value; and
   responsive to a violation of at least one constraint in a set of constraints, restoring the move cells to an original placement in the data set.

2. The computer implemented method of claim 1, wherein the user configurable move limit is determined by assigning a user configurable critical fanout value for a set of cells in the data set, and assigning a user configurable move limit for the set of cells exceeding the user configurable critical fanout value, wherein the set of cells connect to a set of critical nets in the data set.

3. The computer implemented method of claim 1, wherein the electrical constraints include capacitance limits and skew limits.

4. The computer implemented method of claim 1, wherein the set of constraints include arrival time constraints, electrical constraints, or user configurable move limits.

5. A computer program product stored on a computer-readable medium, for managing constraints for detailed placement transforms in a physical synthesis environment, the computer program product, comprising:
   computer usable program code for computing delay constraint coefficients for a data set using data from a static timing analysis and from legal physical placement data;
   computer usable program code for computing a net weight for each net in the data set;
   computer usable program code for computing a weighted total wire length for the data set;
   computer usable program code for assigning a user configurable move limit for a set of cells, wherein the set of cells connect to a set of critical nets in the data set;
   computer usable program code for creating move cells by moving a subset of cells according to a detailed placement transform;
   computer usable program code for sliding the move cells to make a legal placement;
   computer usable program code for identifying a subset of nets that are changed by the legal placement of the move cells;
   computer usable program code for computing a half perimeter wire length change for each output net that is a member of the subset of nets;
   computer usable program code for computing a Manhattan distance change for each source-sink gate pair within the move cells to form a transformed data set;
   computer usable program code for determining whether a user configurable move limit has been exceeded;
   computer usable program code for computing a weighted total wire length incremented value for the transformed data set;
   computer usable program code for restoring move cells to an original placement in the data set if the weighted total wire length incremented value of the transformed data set comprises a zero or positive value;
   computer usable program code for evaluating arrival time constraints, electrical constraints, and user configurable move limits if the weighted total wire length incremented value of the transformed data set comprises a negative value; and
   computer usable program code for restoring the move cells to an original placement in the data set, responsive to violating one or more of arrival time constraints, electrical constraints, or user configurable move limits.

6. The computer program product of claim 5, wherein the user configurable move limit is determined by assigning a user configurable critical fanout value for a set of cells in the data set; and
   assigning a user configurable move limit for the set of cells exceeding the user configurable critical fanout value, wherein the set of cells connect to a set of critical nets in the data set.

7. The computer program product of claim 5, wherein the electrical constraints include capacitance limits and skew limits.

8. The computer program product of claim 5, wherein the set of constraints include arrival time constraints, electrical constraints, or user configurable move limits.

* * * * *